US008647433B2

(12) United States Patent
Liu et al.

(10) Patent No.: US 8,647,433 B2
(45) Date of Patent: Feb. 11, 2014

(54) GERMANIUM INGOTS/WAFERS HAVING LOW MICRO-PIT DENSITY (MPD) AS WELL AS SYSTEMS AND METHODS FOR MANUFACTURING SAME

(75) Inventors: Weiguo Liu, San Leandro, CA (US); Xiao Li, Nanyang (CN)

(73) Assignee: AXT, Inc., Fremont, CA (US)

( * ) Notice: Subject to any disclaimer, the term of this patent is extended or adjusted under 35 U.S.C. 154(b) by 1094 days.

(21) Appl. No.: 12/636,778

(22) Filed: Dec. 13, 2009

(65) Prior Publication Data

US 2011/0143091 A1   Jun. 16, 2011

(51) Int. Cl.
*C30B 21/02* (2006.01)

(52) U.S. Cl.
USPC .................. 117/81; 117/82; 117/83; 117/941

(58) Field of Classification Search
USPC .......................................... 117/81, 82, 83, 941
See application file for complete search history.

(56) References Cited

U.S. PATENT DOCUMENTS

| 3,898,051 | A  | * | 8/1975 | Schmid ............................ 117/83 |
| 6,254,677 | B1 | * | 7/2001 | Hashio et al. ................. 117/206 |
| 8,506,706 | B2 | * | 8/2013 | Liu .................................. 117/81 |
| 2007/0266931 | A1 | * | 11/2007 | Mueller et al. .................. 117/83 |
| 2008/0035051 | A1 | * | 2/2008 | Schmid et al. .................. 117/74 |
| 2009/0047203 | A1 |   | 2/2009 | Mueller et al. |

FOREIGN PATENT DOCUMENTS

| JP | 11-021120 A | 1/1999 |
| JP | 11-335194 A | 12/1999 |
| JP | 2004277266 A | * 10/2004 .............. C30B 11/00 |

OTHER PUBLICATIONS

International Search Report and Written Opinion of the International Search Authority; dated Aug. 31, 2011, in the corresponding PCT application PCT/US2010/059990, 8 pages.

* cited by examiner

*Primary Examiner* — Matthew Song
(74) *Attorney, Agent, or Firm* — Alston & Bird LLP

(57) ABSTRACT

Systems and methods are disclosed for crystal growth including features of reducing micropit cavity density in grown germanium crystals. In one exemplary implementation, there is provided a method of inserting an ampoule with raw material into a furnace having a heating source, growing a crystal using a vertical growth process wherein movement of a crystallizing temperature gradient relative to the raw material/crucible is achieved to melt the raw material, and growing, at a predetermined crystal growth length, the material to achieve a monocrystalline crystal, wherein monocrystalline ingots having reduced micro-pit densities are reproducibly provided.

14 Claims, 11 Drawing Sheets

GERMANIUM INGOTS/WAFERS HAVING LOW MICRO-PIT DENSITY (MPD) AS WELL AS SYSTEMS AND METHODS FOR MANUFACTURING SAME

BACKGROUND

1. Field

Systems and methods herein relate generally to monocrystalline germanium ingots/wafers and in particular to growth of such ingots/wafers with reduced micro-pit density (MPD).

2. Description of Related Information

Electronic and opto-electronic device manufacturers routinely require commercially grown, large and uniform single semiconductor crystals which, when sliced and polished, provide substrates for microelectronic device production. The growth of a semiconductor crystal involves heating raw material to its melting point to create a crystalline raw material melt, bringing the melt into contact with a high quality seed crystal, and allowing the crystallization of the melt when in contact with the seed crystal. A number of different processes for accomplishing this are known. These include the Czochralski (Cz) process and its variant the Liquid Encapsulated Czochralski (LEC) process, the Horizontal Bridgman and Bridgman-Stockbarger processes (HB) and their vertical variants (VB), and the gradient freeze (GF) and its variant, the vertical gradient freeze (VGF) processes. See for example "Bulk Crystal Growth of Electronic, Optical and Optoelectronic Materials" P. Clapper, Ed., John Wiley and Sons Ltd, Chichester, England, 2005, for general discussions of these techniques and their application to the growth of various materials.

The crystallization of the melt forms an essentially cylindrical crystal (an ingot) along a vertical axis with the seed crystal below the crystalline raw material(s). The equipment necessary to form the semiconductor crystal includes a crystal growth furnace, an ampoule, a crucible, and sometimes a crucible support. The crucible may also have a lower, narrow portion, called a seed well.

Drawbacks exist with the conventional crystal growth process and crystal growth equipment. For example, known crystal growth processes often create crystals that have excessive micro-pits or micro-cavities which result in imperfections, flawed devices and/or otherwise reduce the overall useful quantity of the crystal grown using such processes. Such issues and reduction in useful grown crystal quantity result in a lower yield. Accordingly, there is a need for a crystal growth systems and methods that reproducibly provide high quality ingots/wafers and otherwise overcome such drawbacks in existing systems.

SUMMARY

Systems and methods consistent with the invention are directed to growth of moncrystalline germanium.

In one exemplary implementation, there is provided a method of inserting an ampoule with raw material into a furnace having a heating source, growing a crystal using, e.g., a vertical growth process wherein movement of a crystallizing temperature gradient relative to the raw material/crucible is achieved to melt the raw material and reform it in monocrystalline form, and growing, at a predetermined crystal growth length, the crystal using a vertical growth process to melt the material and reform it as a monocrystalline compound, wherein monocrystalline ingots having reduced micro-pit densities are reproducibly provided.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

BRIEF DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF EXEMPLARY IMPLEMENTATIONS

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

The apparatus and method are particularly applicable to an apparatus and method for germanium (Ge) crystal growth and it is in this context that the apparatus and method are described. It will be appreciated, however, that the apparatus and method may have greater utility since the apparatus and method can be used to produce other mono- and/or polycrystalline ingots having low micropit densities.

Figure 1A:
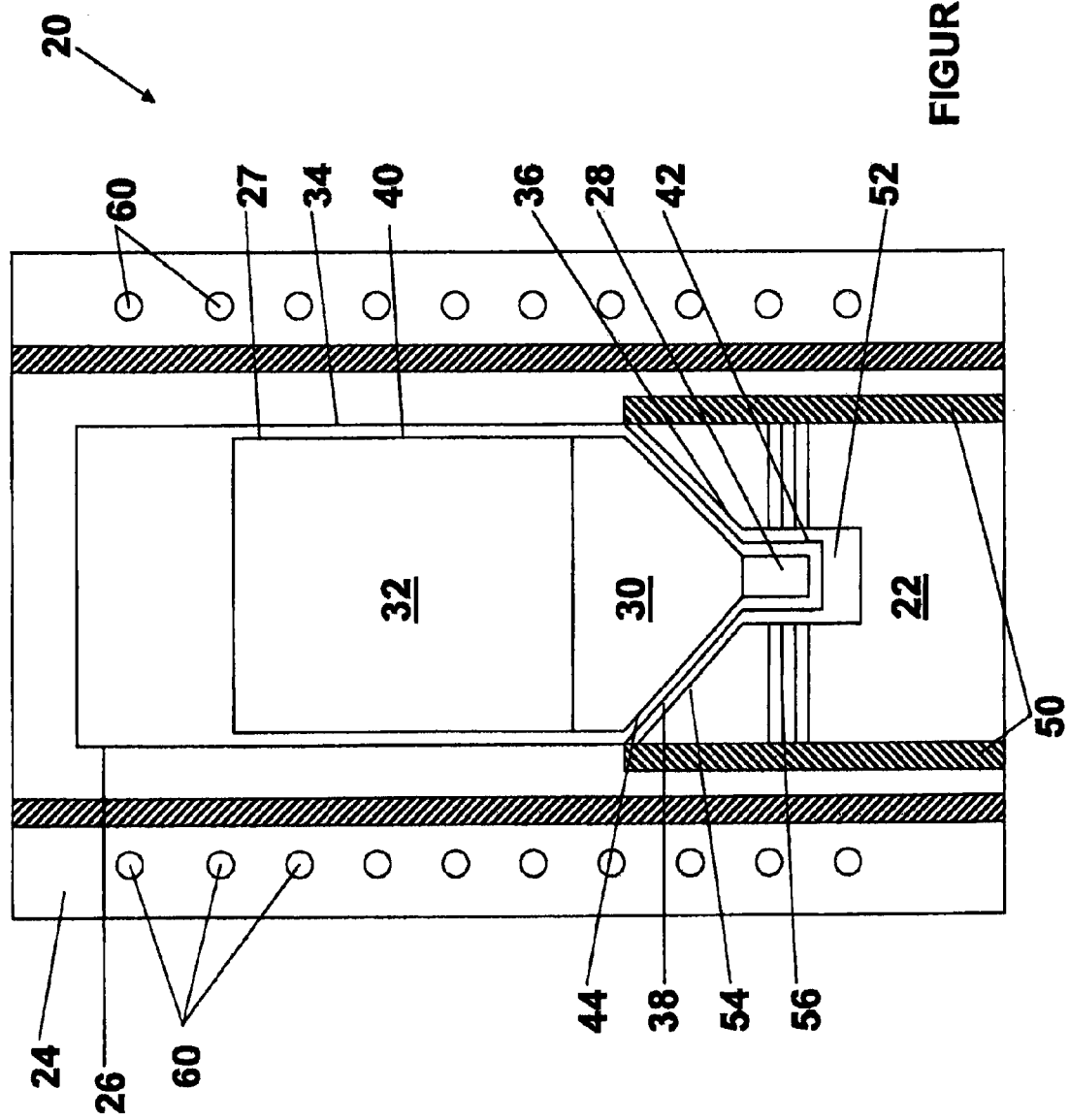
FIGS. 1A and 1B are cross sectional views of exemplary crystal growth apparatus and crucible, consistent with certain aspects related to the innovations herein.

FIG. 1A is a cross sectional view of an example of a crystal growth apparatus 20. The exemplary apparatus may include a crucible support 22 in a furnace 24, such as a furnace that establishes a crystallizing temperature gradient which may be used in a suitable vertical growth process, e.g., a vertical gradient freeze (VGF) and/or vertical Bridgman (VB) crystal growing and/or, if the furnace is moveable, a vertical Bridgman-Stockbarger process. In implementations that include a crucible support, the crucible support 22 provides physical support for and allows for thermal gradient control to an ampoule 26 (that in one implementation may be made of quartz) containing a crucible 27. In some implementations, when the furnace is in operation, the crucible support 22 may be moved during the crystal growth process. In alternative implementations, the crucible support may be fixed and the furnace, when in operation, can be moved during the crystal growth process. The crucible 27 may contain a seed crystal 28, a grown monocrystalline crystal/compound 30 formed on top of the seed crystal and raw melt material 32. In one implementation, the crucible 27 may be a pyrolitic boron nitride (pBN) material with a cylindrical crystal growth portion 34, a smaller diameter seed well cylinder 36 and a tapered transition portion 44. The crystal growth portion 34 has a diameter equal to the desired diameter of the crystal product. The current industry standard crystal diameters are 2 inch, 3 inch, 4 inch, 5 inch, 6 inch and 8 inch ingots that can be cut into wafers. At the bottom of the crucible 27, the seed well cylinder 36, in one implementation, may have a closed bottom and a diameter slightly larger than that of a high quality seed crystal 28. In one illustrative implementation, for example, the diameter could be in the range of about 6-25 mm, and may have a length on the order of about 30-50 mm. The cylindrical crystal growth portion 34 and the seed well cylinder 36 may have straight walls or may taper outwardly on the order of one to a few degrees to facilitate the removal of the crystal from the crucible 27. The tapered transition portion 38 between the growth portion 34 and the seed well cylinder 36 has an angled side wall pitched at, for example approximately 45-60 degrees, with a larger diameter equal to and connected to the growth zone wall and a narrower diameter equal to and connected to the seed well wall. The angled side wall may also be at other angles that are more steep or less steep than about 45-60 degrees.

Before insertion in the crystal growth furnace 24, the crucible 27 is loaded with raw materials and inserted into the ampoule 26. The ampoule 26 may be formed of quartz material. The ampoule 26 typically has a shape similar to that of the crucible 27. The crucible may be cylindrical in a crystal growth region 40, cylindrical with a narrower diameter in its seed well region 42, and have a tapered transition region 44 between the two regions. Further, the crucible 27 may fit inside the ampoule 26 with a narrow margin between them. The ampoule 26 is closed at the bottom of its seed well region 42 and, like the crucible, sealed on top after the crucible and raw materials are loaded. The bottom of the ampoule 26 may have the same funnel shape as the crucible 27. Without restriction to any specific structure shown by way of illustration, not limitation, herein, an apparatus for germanium crystal growth consistent with the innovations herein may comprise a crystal growth furnace including a heating source (e.g., heating elements 60) and a plurality of heating zones, an ampoule configured to be loaded into the furnace, wherein the ampoule includes a loading container and a crucible with a seed well, optionally an ampoule support, and a controller coupled to the crystal growth furnace and the ampoule support, the controller controlling the one or more heating zones of the heating source and the movable ampoule support to perform a vertical gradient freeze process on the crucible when it is in the furnace. Further, the crystallizing temperature gradient and/or the crucible are then moved relative to each other to melt the raw material and then reform the material as a monocrystalline germanium ingot, wherein, as a result of vertical growth processes performed in the apparatus, the apparatus reproducibly provides germanium ingots having micro-pit densities of reduced quanta. For example, germanium ingots having micropit densities of the following ranges may be reproducibly provided: greater than about $0.025/cm^2$ and less than about $0.51/cm^2$; greater than about $0.025/cm^2$ and less than about $0.26/cm^2$; greater than about $0.025/cm^2$ and less than about $0.13/cm^2$; less than about $0.13/cm^2$; and greater than about $0.025/cm^2$ and less than about $0.26/cm^2$.

Turning back to the exemplary system of FIG. 1A discussed above, the ampoule and crucible may have tapered (funnel shaped) regions. In implementations where ampoule-crucible combination has a funnel shape, the crucible support 22 accommodates this funnel shape and holds the ampoule 26 stable and upright inside the furnace 24. In other implementations, the ampoule-crucible combination may retain different shapes, and the basic structure of the crucible support 22 would be changed accordingly to fit the specific different shape. According to another implementation, the stability and strength to the ampoule and its contents are provided through a solid, thin-walled cylinder 50 of the crucible support 22. The solid, thin-walled cylinder 50 accommodates the funnel end of the ampoule structure 26. In one implementation, the crucible support cylinder 50 is made of a heat conducting material, preferably quartz. In other implementations, silicon carbide and ceramic may also be utilized to form the crucible support cylinder 50. The cylinder 50 makes a circle of contact with ampoule 26, where the upper rim of the cylinder 50 meets the shoulder of the ampoule's tapered region 38. Such configuration leads to minimal solid-to-solid contact which ensures that little or no undesirable, relatively uncontrollable heat conduction occurs. As a result, heating is able to be generated by other, more controllable processes.

In other implementations, a low density insulating material, such as ceramic fiber, fills the majority of the inside of the support cylinder 50 with only a hollow axial core 52 in approximately the center of the insulating material left empty to receive the seed well 42 of the ampoule 26. In other implementations, the low-density insulating material may also comprise alumina fiber (1,800.degree. C.), alumina-silica fiber (1,426.degree. C.), and/or zirconia fiber (2,200.degree. C.). The insulating material is carefully placed in the crucible support 22. The weight of the ampoule 26, as it sits on top of the cylinder 50, pushes the insulating material down and forms the slanted insulating material edge 54. Filling the majority of the cylinder interior with a low-density insulator reduces the flow of air, which ensures that little or no undesirable, relatively uncontrollable convection flow will take place. Like conduction, convection is an uncontrollable heat transfer method that may work to the detriment of the VGF/VB and other crystal growth process herein.

As illustrated in the exemplary system of FIG. 1A, the hollow core 52, with a diameter approximately equal to the ampoule seed well 42, extends downward to a small distance below the bottom of the ampoule seed well 42. In another implementation, the hollow core 52 may extend through the crucible support from the bottom of the seed well to the bottom of the furnace apparatus 24. The hollow core 52 provides a cooling path from the center of the crystal. It contributes to cooling in the seed well and in the center of the growing crystal. With this construction, heat energy can escape down through the center of the solid crystal and seed, down through this hollow core 52 in the insulating material within the crystal support 22. Without the hollow core 52, the temperature of the center of the cooling ingot would naturally be higher than the crystal material nearer to the outer surface. In this case, the center of the ingot in any horizontal cross section would crystallize later after its perimeter had solidified. Crystals with uniform electrical properties cannot be made under these conditions. In implementations having a hollow core 52 included in the crystal support method, heat energy is conducted down through the bottom of the ampoule 26 and the hollow core 52 from where it radiates back out of radiation channels 56. It is important to reduce heat energy from the center of the growing crystal so that the isothermal layers are kept flat across the crystal diameter. Maintaining a flat crystal-melt interface allows the production of crystals with uniform electrical and physical properties.

In some implementations, low-density insulating material within the cylinder 50 may obstruct the flow of heat radiation from a set of furnace heat elements 60 to the ampoule 26 in the seed well region 42, so this method requires the creation of a plurality of horizontal radiation channels/openings/tunnels 56 through the insulation material. The radiation channels 56 penetrate the insulating material to provide heat radiation outlets to controllably transfer heat from the furnace heating elements 60 to the ampoule seed well 42. The number, shape and diameter of the radiation channels 56 varies depending on specific conditions. The radiation channels may also be slanted, bent or wave-like. The radiation channels also do not necessary have to be continuous, as they may extend only partially through the insulating material. This helps minimize convection currents. In one implementation, the diameter of these channels is small, on the order of a pencil width, so that convection airflow is insignificant. Larger holes with cross-sectional area on the order of a square inch or more can also be used according to other implementations of the invention. The radiation channels 56 through the insulating material also work in conjunction with the hollow core 52 in the center of the insulating material to radiate heat energy drawn from the center of the crystal, and cool the crystal with planar isothermal temperature gradient layers. The radiation channels 56 enable temperature control and directly relate to crystal growth yield.

The furnace 24 as shown in FIG. 1A is an example of a furnace that may be used for both Vertical Gradient Freeze (VGF) and Vertical Bridgman (VB) or Vertical Bridgman-Stockbarger (VBS) crystal growth processes. Other furnaces may also be used. In the VGF crystal growth process the crystallizing temperature gradient within a heat source, which may itself be stationary, is being moved while the crystal is held stationary. In the VB crystal growth process, the heat source and its fixed crystallizing temperature gradient are kept stationary while the crystal is moved. In the VBS crystal growth process the heat source and its fixed crystallizing temperature gradient are moved while the crystal is kept stationary.

Figure 1B:
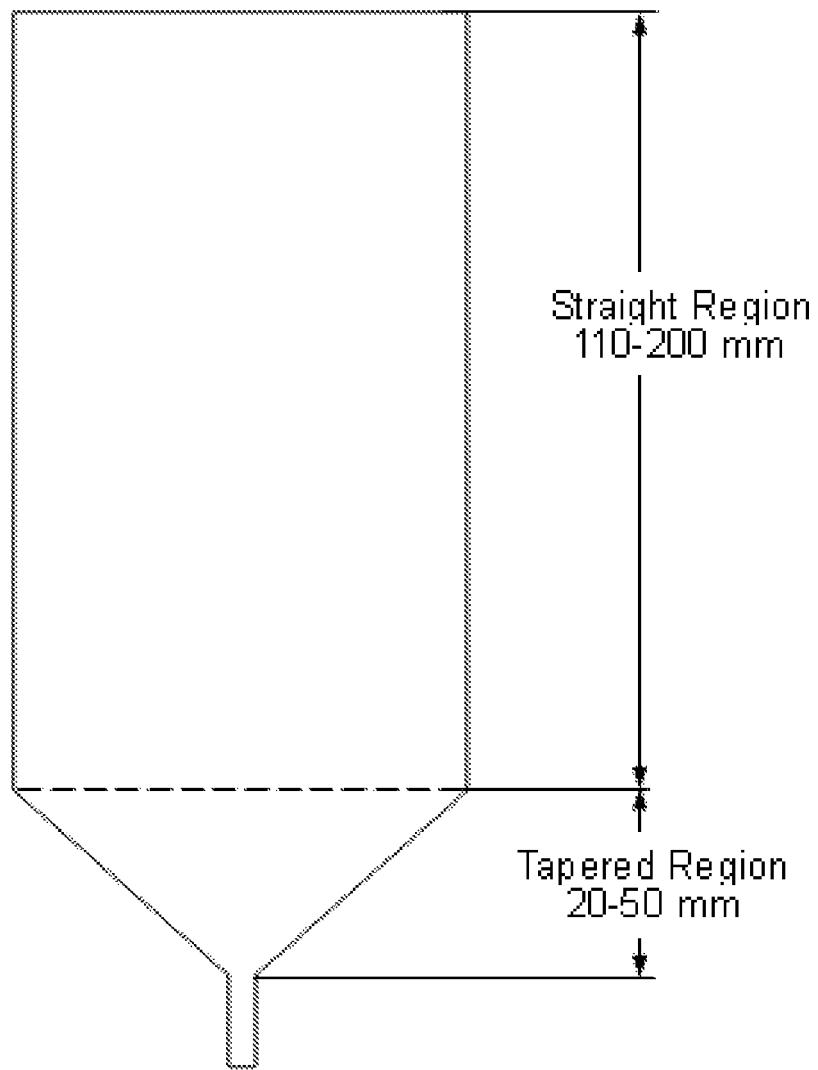

FIG. 1B is a cross sectional view of exemplary crucible 99 consistent with certain aspects related to the innovations herein. Referring to FIG. 1B, an exemplary crucible for some of the illustrative crystal growth furnaces herein may have a tapered crystal growth region of about 25 mm to about 50 mm in length. Further, in some exemplary implementations the crucible 99 and ingots may have a growth length after the taper ("predetermined growth length") of about 110 mm to about 200 mm in length.

Figure 2:
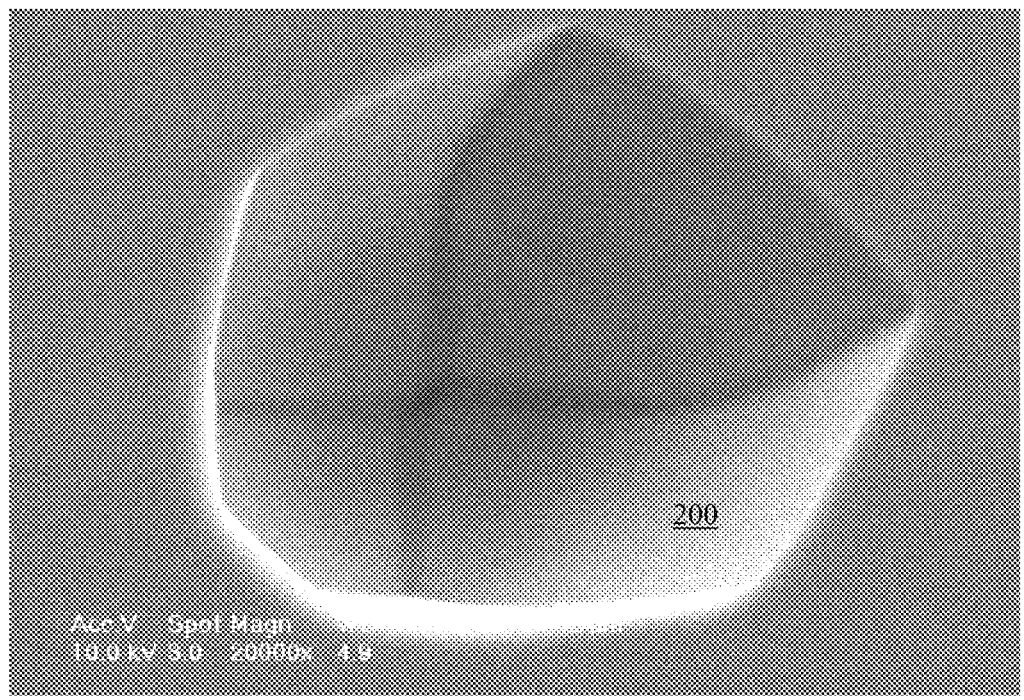
FIG. 2 illustrate an exemplary micropit, consistent with certain aspects related to the innovations herein.

FIG. 2 illustrates a region of a crystal ingot or wafer containing a micropit 200, consistent with aspects related to the innovations herein. As seen in FIG. 2, presence of such micropits 200 produces noticeable dark spots and associated problems in the grown germanium material. When the micropit count is too high, resulting ingots or wafers may be unusable and thus require recycling. Therefore, micropits or microcavities can reduce the yield of the crystal growth process and it is desirable to reduce such defects. Systems, furnaces and crystal growth processes that overcome such micropit problems result in larger yields.

Figure 3A:
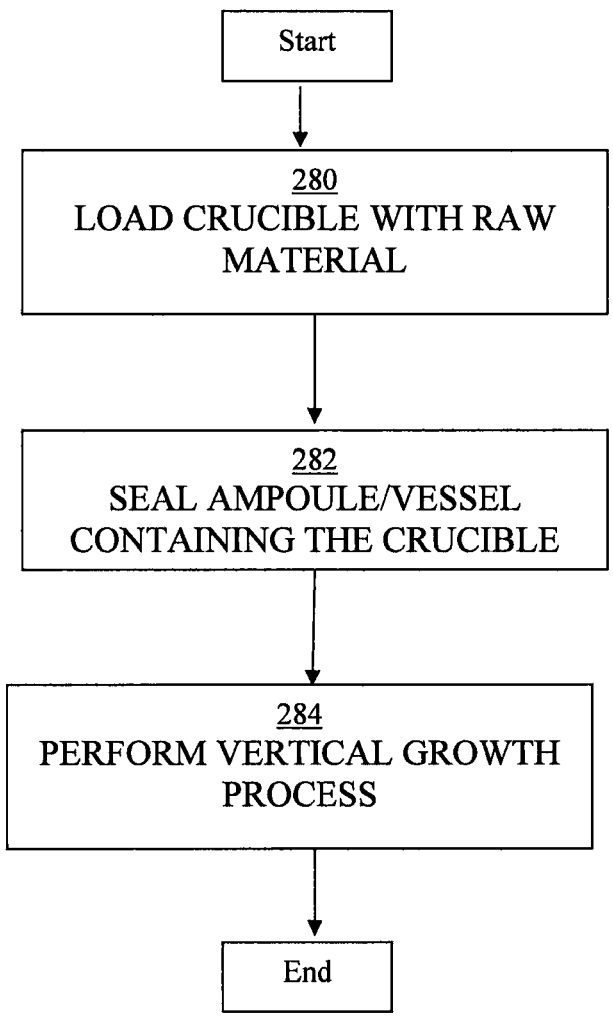
FIGS. 3A and 3B illustrate exemplary methods of crystal growth, consistent with certain aspects related to the innovations herein.

FIG. 3A illustrates, broadly, exemplary implementations of crystal growth consistent with certain aspects related to the innovations herein. According to such implementations, an exemplary method may comprise loading raw Ge material into the crucible 280, sealing the crucible and/or container or vessel holding the crucible 282, placing the crucible into the crystal growth furnace, melting the raw Ge material in the crucible to create a melt, and performing a vertical growth process to form the monocrystalline germanium ingot 284. Moreover the method may include one or more further steps including controlling a crystallizing temperature gradient of the melt while placing the melt in contact with the seed crystal, forming a monocrystalline germanium ingot via movement of the crystallizing temperature gradient and/or the crucible relative to each other, and cooling the monocrystalline germanium ingot. Further, as a result of the vertical growth processes herein, germanium ingots having micro-pit densities of reduced quanta are reproducibly provided. For example, germanium ingots having micropit densities of the following ranges may be reproducibly provided: greater than about $0.025/cm^2$ and less than about $0.51/cm^2$; greater than about $0.025/cm^2$ and less than about $0.26/cm^2$; greater than about $0.025/cm^2$ and less than about $0.13/cm^2$; less than about $0.13/cm^2$; and greater than about $0.025/cm^2$ and less than about $0.26/cm^2$. Further, single crystal substrates produced according to the innovations herein may have, from starting growth portion to end of growth portion, a carrier concentration of about $9 \times 10^{17}$ to about $4 \times 10^{18}$ or about $5 \times 10^{18}/cm^3$, and a resistivity of about $7 \times 10^{-3}$ to $2 \times 10^{-3}$ or $3 \times 10^{-3}$ Ω·cm, with a mobility of about 950 $cm^2/Vs$ to about 450 $cm^2/Vs$. Moreover, the dislocation density may less than about $500/cm^2$, or even less than about $200/cm^2$.

Figure 3B:
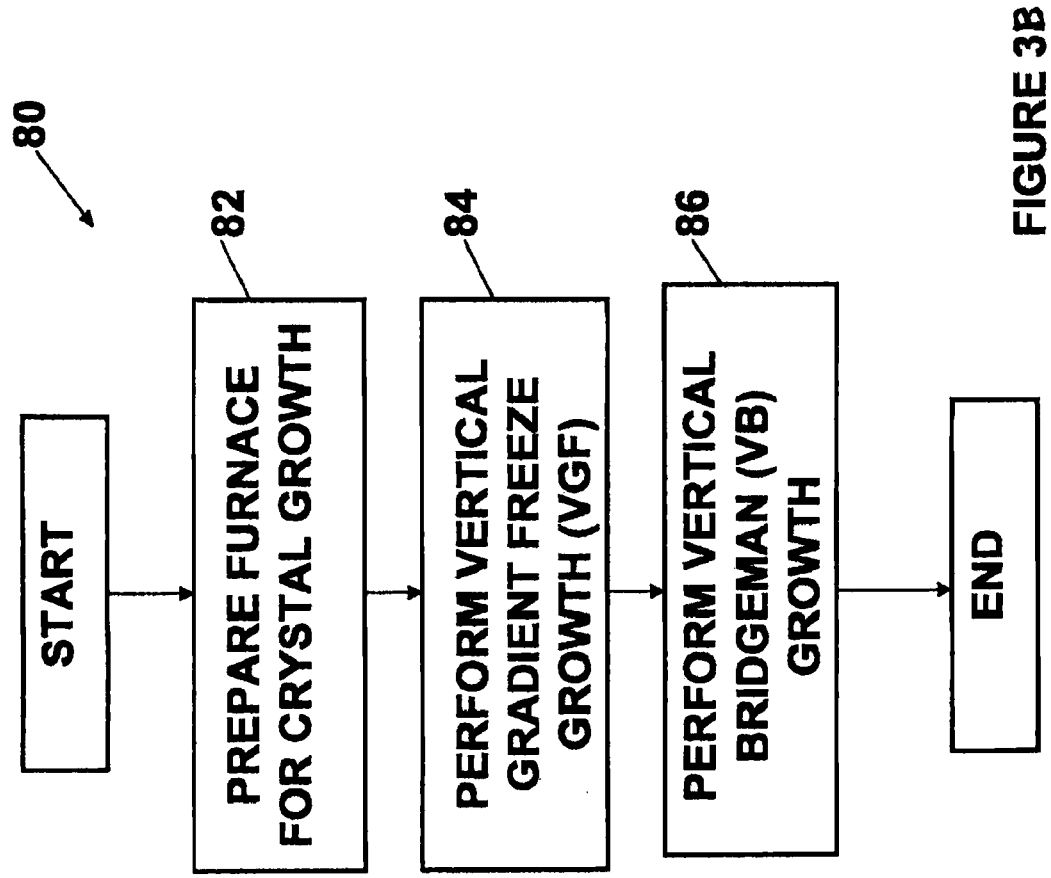

FIG. 3B illustrates another exemplary method 80 for crystal growth using Vertical Gradient Freeze (VGF) and Vertical Bridgman (VB) process steps that may reduce the micropit densities and result in higher yields, consistent with aspects related to the innovations herein. In such exemplary crystal growth process, the furnace is prepared for crystal growth (82) as described above. For the initial crystal growth from the seed, the VGF process (84) is used. At a specified point in the crystal growth process, the VB process (86) or the VBS process may be used to complete the crystal growth. When the VB or VBS process is used, the melt/solid line is held at a level and then the process is continued with fixed conditions since the process changes typically required for VGF process as the volume decreases are not needed. In one illustrative implementation of the process, for example, the VB process may be used at approximately 12-15 mm (½ inch), or at about 12-45 mm, or even higher, above the tapered region 38 as shown in FIG. 1A. Consistent with the implementations and experimental results herein, combination of the VGF and VB processes may result in better crystals with fewer micropits. The above exemplary methods may be used with the furnace shown in FIG. 1A, though may also be used with any other crystal growth furnace. The method may be used to grow crystals from 2 inch-6 inch, or larger, in diameter.

In further vertical growth implementations, according to exemplary innovations herein, methods of growing monocrystalline germanium (Ge) crystals in a crystal growth furnace including a heating source, a plurality of heating zones, an ampoule and a crucible, are provided. In these implementations, an exemplary method may comprise loading raw Ge material into the crucible, sealing the crucible and the container, placing the crucible into the crystal growth furnace, melting the raw Ge material in the crucible to create a melt, controlling a crystallizing temperature gradient of the melt while placing the melt in contact with the seed crystal, forming a monocrystalline germanium ingot via movement of the crystallizing temperature gradient and/or the crucible relative to each other, and cooling the monocrystalline germanium ingot. Further, as a result of the vertical growth processes, germanium ingots having micro-pit densities of reduced quanta are reproducibly provided. For example, germanium ingots having micropit densities of the following ranges may be reproducibly provided: greater than about $0.025/cm^2$ and less than about $0.51/cm^2$; greater than about $0.025/cm^2$ and less than about $0.26/cm^2$; greater than about $0.025/cm^2$ and less than about $0.13/cm^2$; less than about $0.13/cm^2$; and greater than about $0.025/cm^2$ and less than about $0.26/cm^2$. Moreover, the method may further comprise adding arsenic (As), gallium (Ga) and/or antimony (Sb) as a dopant.

In one exemplary implementation, the method may include growth via a vertical gradient freeze (VGF) process and include a cooling process performed at a cooling rate of about 0.1 to about 10° C./hour and at a temperature gradient of between about 0.5 to about 10 μm. In another exemplary implementation, the method may include crystal growth including a vertical Bridgman (VB) process, at a cooling rate of about 0.1 to about 10° C./hour and a temperature gradient from about 0.5 to about 10° C./cm. In yet another exemplary implementation, the method of crystal growth may include crystal growth/cooling including a vertical gradient freeze (VGF) process and/or vertical Bridgman (VB) process, at a cooling rate of about 3° C./hour for about the first 5 hours and of about 30° C./hour to about 45° C./hour for a remaining period of the cooling process.

Figure 4:
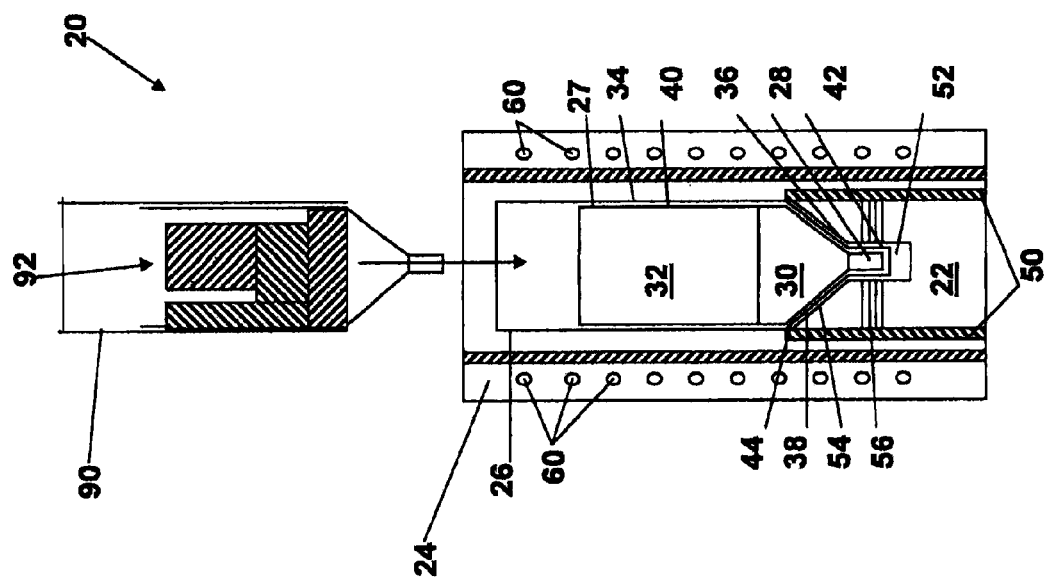
FIG. 4 illustrates an exemplary method for loading a crystal growth furnace with a crucible loaded with germanium, consistent with certain aspects related to the innovations herein.

As shown in FIG. 4, a loading crucible 90 may be located above the crucible 27 and allows the crucible 27 to be loaded with more raw material. In particular, the raw germanium material 92 is solid and therefore cannot be tightly packed into the crucible 27 to be melted. Thus, the loading crucible is used to hold extra raw material that can be melted and then drain down into the crucible which results in a larger germanium charge in the crucible 27 which in turn results in a larger length germanium crystal. For example, about 35 to about 65% of the raw material may be initially loaded into the loading crucible 90 and about 65 to about 35% of the raw material is loaded directly into the crucible 27. For example, consistent with some methods for crystal growth herein, a charge of approximately 10 kg may be loaded into the furnace to produce a 200 mm 4 inch ingot having the low micropit densities herein.

Now, an example of the growth of a 4" (100 mm) diameter germanium crystal grown using the above crystal growth furnace and method (VGF and VB combined) is described in more detail. To grow one exemplary crystal, the dimensions of the crucible were 100 mm diameter and 200 mm length crystal growth region 40. The diameter of the crucible in the seed well region 42 was 7 mm. In one exemplary implementation, a 10 kg of germanium precursor material may be loaded for ingot growth. In operation, at first, the germanium seed crystal is inserted in the bottom portion of the pBN crucible 27. Next, about 10 kg of germanium material and about 36 g of a boron oxide as the liquid sealant may be added therein. Then, the charge loaded pBN crucible was inserted in a quartz ampoule. The quartz ampoule was sealed under reduced pressure with a quartz cap. The quartz ampoule is then loaded in the furnace and placed on the crucible support.

Once the ampoule is loaded into the furnace, the quartz ampoule may be heated at the rate of approximately 150-200° C./hour. In one exemplary process, when the temperature reaches the melting point at the seed portion and about 3-18° C. over the melting ranges of germanium (~940-955° C.) at the crystal growth region, the temperature point may be held until all of the monocrystalline germanium material melts (e.g., in some implementations, approximately 2-4 hours). Once the monocrystalline germanium material melt, a VGF method was first used for crystal growth. The temperature may then be reduced in the lower heating zone slowly to let crystal growth starting at the seed part begin and continue through the transition region until the crystal growth region cools, in association with a VGF and/or VB process(es), at a cooling rate of about 3° C./hour for about the first 5 hours and of about 30° C./hour to about 45° C./hour for a remaining period of the cooling process after crystal growth process is completed. In another exemplary implementation, crystal growth cooling may occur at a cooling rate of about 0.1 to about 10° C./hour and at a temperature gradient of between about 0.5 to about 10° C./cm (e.g., associated with a VGF process). Further, in an exemplary VB process, a crystal growth cooling rate of 0.3-0.47° C./hour may be used, while maintaining the temperature gradient from 1.2 to 1.8° C./cm.

According to some exemplary combined VGF and VB processes herein, when the crystal has grown about 1 to about 3 inches high in the crystal growth region, the VB process may be started. In the VB process, the crucible down speed is controlled to precise cooling/growing parameters, such as a cooling rate of about 0.2 to about 0.5° C./hr and/or a temperature gradient of about 0.3 to about 2.5° C./cm in the crystal growth zone. Resulting crystals of about 190 mm length and high quality (i.e., low micro-pit density or "low MPD") may be achieved via such a process, from a 200 mm long ingot, which is a crystal yield of about 95%. By means of such processes, germanium ingots having micropit densities of the following ranges may be reproducibly provided: greater than about $0.025/cm^2$ and less than about $0.51/cm^2$; greater than about $0.025/cm^2$ and less than about $0.26/cm^2$; greater than about $0.025/cm^2$ and less than about $0.13/cm^2$; less than about $0.13/cm^2$; and greater than about $0.025/cm^2$ and less than about $0.26/cm^2$.

Further, single crystal substrates produced according to the innovations herein may have, from starting growth portion to end of growth portion, a carrier concentration of about $9 \times 10^{17}$ to about $4 \times 10^{18}$ or about $5 \times 10^{18}/cm^3$ (range of about $9 \times 10^{17}$ to about $4.86 \times 10^{18}/cm^3$ being measured), and a resistivity of about $7 \times 10^{-3}$ to $2 \times 10^{-3}$ or $3 \times 10^{-3}$ $\Omega cm$ (range of about $7.29 \times 10^{-3}$ to about $2.78 \times 10^{-3}$ $\Omega cm$ being measured), with a mobility of about 950 $cm^2/Vs$ to about 450 $cm^2/Vs$ (values of 955 $cm^2/Vs$ and 467 $cm^2/Vs$ being measured). Moreover, the dislocation density may less than about $500/cm^2$, or even less than about $200/cm^2$.

Consistent with FIGS. 4A-5, systems and methods for growing monocrystalline germanium (Ge) crystals are provided, wherein additional raw material melt may be added to the crucible (e.g., in a VGF and/or VB process, etc.) once the original raw material charge has been melted, but before crystal growth has started, thus allowing growth of longer, monocrystalline ingots. Moreover, the method may include loading first raw Ge material into a crucible that includes a seed well holding a seed crystal, loading second raw Ge material into a container for supplementing the Ge melt material, sealing the crucible and the container in an ampoule, and placing the ampoule with the crucible into a crystal growth furnace having a movable ampoule support that supports said ampoule. Further, exemplary implementations may include melting the first raw Ge material in the crucible to create a melt, melting the second raw Ge material in said container, and adding the melted second raw Ge material to said melt. Other exemplary implementations may include controlling the crystallizing temperature gradient of the melt so that the melt crystallizes when in contact with the seed crystal and forms a monocrystalline germanium ingot and, optionally, cooling the monocrystalline germanium ingot.

In one exemplary implementation, the step of forming the monocrystalline germanium ingot may include creating a temperature gradient of about 0.3 to about 2.5° C./cm in the crystal growth zone. Additionally, the monocrystalline germanium ingot may be cooled at a rate of about 0.2 to about 0.5° C./hr. Further, the crucible may be maintained stationary during movement of the crystallizing temperature gradient.

According to certain exemplary implementations, the monocrystalline germanium ingot may have a diameter of between about 50 mm to about 200 mm (about 2 inch to about 8 inch). In one implementation, for example, the monocrystalline germanium ingot may have a diameter of 152.4 mm (6 inch). Moreover, monocrystalline germanium ingots and wafers produced via the innovations herein may have micropit densities reproducibly provided within the following ranges: greater than about $0.025/cm^2$ and less than about $0.51/cm^2$; greater than about $0.025/cm^2$ and less than about $0.26/cm^2$; greater than about $0.025/cm^2$ and less than about $0.13/cm^2$; less than about $0.13/cm^2$; and greater than about $0.025/cm^2$ and less than about $0.26/cm^2$.

Regarding systems consistent with the innovations herein, an exemplary apparatus for growing a large-diameter monocrystalline germanium crystal may comprise a crystal growth furnace including a heating source and a plurality of heating zones, an ampoule configured to be loaded into the furnace, wherein the ampoule includes a loading container and a crucible with a seed well, a movable ampoule support, and a controller coupled to the crystal growth furnace and the moveable ampoule support. Further, the controller may control one or more of the heating zones of the heating source and the movable ampoule support to perform a vertical gradient freeze process on the crucible when it is in the furnace.

According to certain implementations, the crystal growth furnace may have a plurality of heating zones, such as between 4 to 8 heating zones, between 5 to 7 heating zones, or 6 heating zones. Consistent with the ingot/wafer diameter desired, exemplary crucibles may have an inner diameter of between about 50 mm to about 200 mm (about 2 to about 8 inches), or, in some implementations, of about 150 mm (about 6 inches).

Figure 5A:
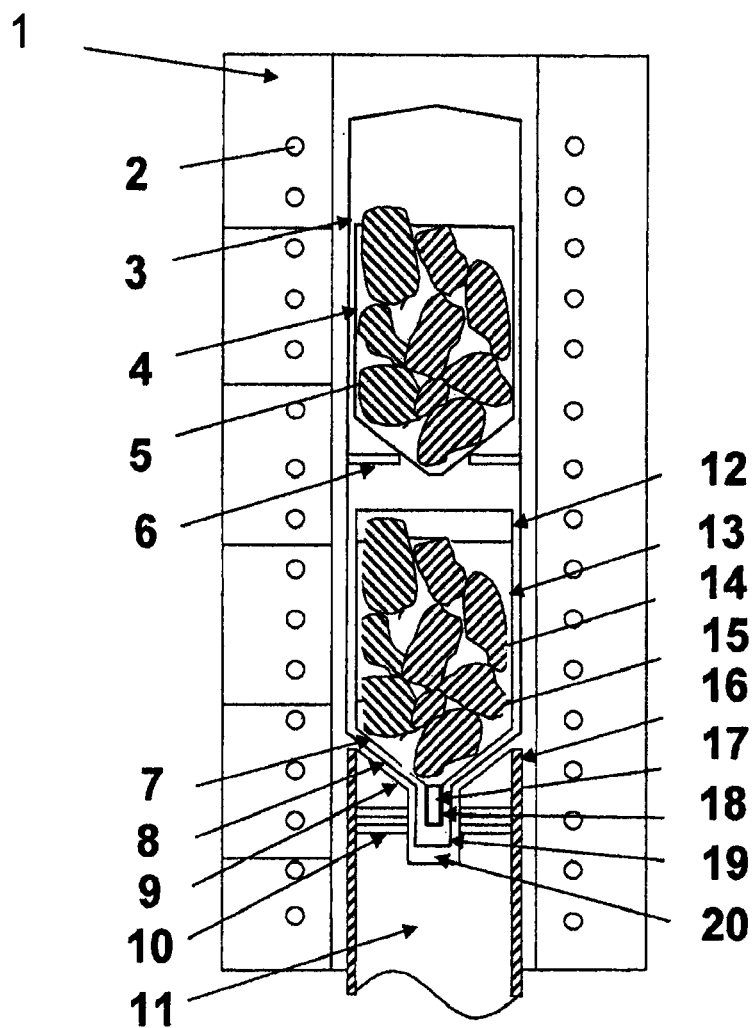
FIGS. 5A-5D illustrate another exemplary implementation of germanium crystal growth, consistent with certain aspects related to the innovations herein.
Figure 5B:
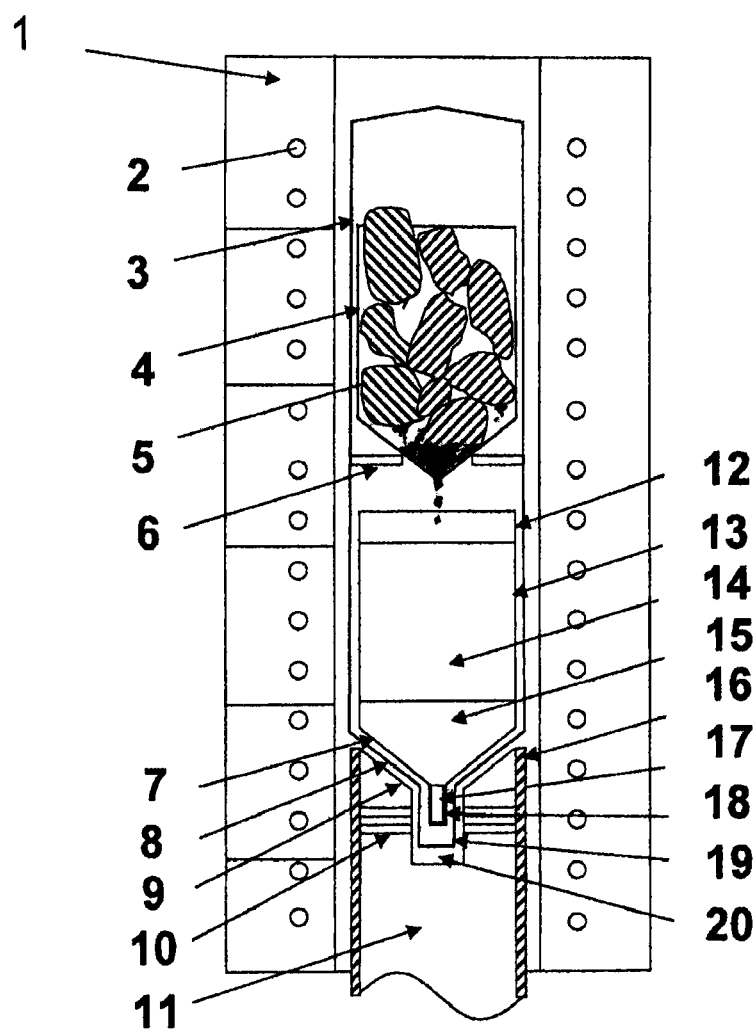
Figure 5C:
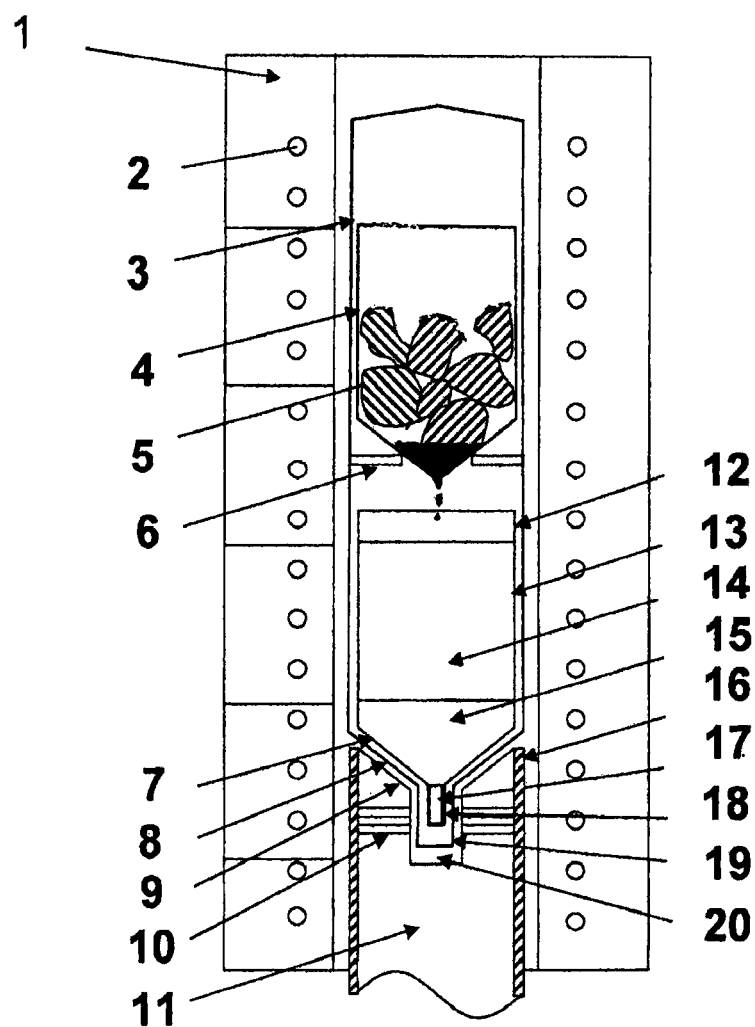
Figure 5D:
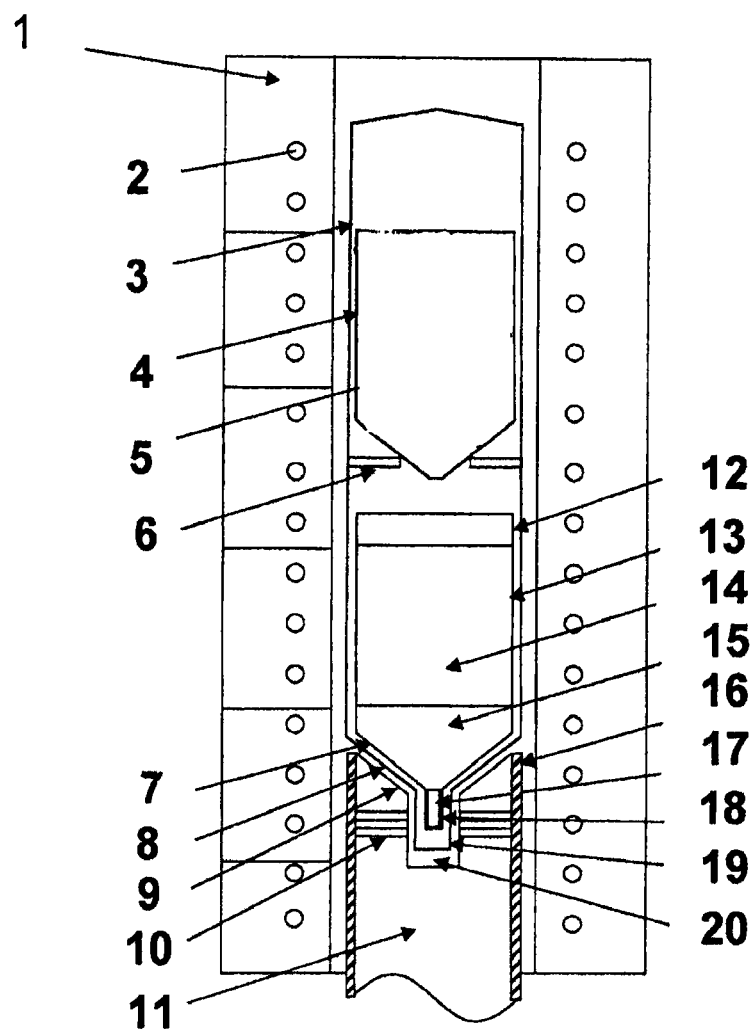

FIGS. 5A-5D illustrate another exemplary implementation of germanium crystal growth, consistent with certain aspects related to the innovations herein. FIGS. 5A-5D are diagrams of longitudinal cross-sections of the apparatus for growing a monocrystalline germanium crystal, illustrating an exemplary crystal growth process consistent with certain aspects related to the invention. FIG. 5A illustrates a cross sectional view of an example of a crystal growth apparatus. The apparatus may include a furnace for use in vertical gradient freeze (VGF) growing processes and/or vertical Bridgman (VB) growing processes, and may include an ampoule support 11 in a furnace 1, wherein the heater 2 is made up of multiple zones, each controlled individually by a computer controlled control system. The temperature of each zone may be adjusted to give the desired overall temperature profile and the temperature gradient for controlled solidification of the melt. The temperature profile and the temperature gradient are adjusted such that the crystallization interface moves consistently/predictably up through the melt, for example, creating a temperature gradient of about 0.3 to about 2.5° C./cm in the crystal ingot growth zone. An ampoule support 11 may be used to provide physical support and thermal gradient control for an ampoule 3 (that, in one implementation, is made of quartz) which contains a crucible 12, which in turn is capable of holding a seed in a seed well 18. The ampoule support 11, when the furnace is in operation, can be moved axially during the crystal growth process. The crucible 12 may contain a seed crystal 17 from which is grown a monocrystal formed on top of the seed crystal. In one implementation, the crucible 12 may be a pyrolytic boron nitride (pBN) structure with a cylindrical crystal growth portion 13, a smaller diameter seed well cylinder 18 and a tapered transition portion 7. The crystal growth portion 13 is open at the top of the crucible 12 and has a diameter equal to the desired diameter of the crystal product. The current industry standard crystal diameters are 50.8, 76.2, 101.6 and 152.4 mm (2, 3, 4 and 6 inch) diameter ingots that can be cut into wafers. In an illustrative implementation, at the bottom of the crucible 12, the seed well cylinder 18 may have a closed bottom and a diameter slightly larger than that of a high quality seed crystal 17, e.g., about 6-25 mm, and a length on the order of 30-100 mm. The cylindrical crystal growth portion 13 and the seed well cylinder 18 may have straight walls or may taper outwardly on the order of one to a few degrees to facilitate the removal of the crystal from the crucible 12. The tapered transition portion 7 between the growth portion 13 and the seed well cylinder 18 has an angled side wall pitched at, for example approximately 45-60 degrees, with a larger diameter equal to and connected to the growth zone wall and a narrower diameter equal to and connected to the seed well wall. The angled side wall may also be at other angles that are steeper or less steep than 45-60 degrees.

In certain exemplary implementations, the ampoule 3 may be made of quartz. The ampoule 3 may have a shape similar to that of the crucible 12. The ampoule 3 is cylindrical in a seed growth region 19, cylindrical with a narrower diameter in its seed well region 19 and has a tapered transition region 8 between the two regions. The crucible 12 fits inside the ampoule 3 with a narrow margin between them. A second, upper container 4, as a raw material container, is seated on a quartz support 6. The quartz support 6 is sealed in the middle part of the ampoule 3. In one implementation of the invention, this second container 4 is made of pBN. It is this second container 4 into which most of the raw material 5 is filled. During the heating process, the raw material is melted and dropped down into the main crucible 12 from the bottom hole of the second container 4. The ampoule 3 is closed at the bottom of its seed well region 19 and sealed on top after the crucible and raw materials are loaded.

In some implementations, the cylinder 16 may be shaped to make a circle of contact with ampoule 3, where the upper rim of the cylinder 16 meets the shoulder of the ampoule's tapered region 8. Such configuration leads to minimal solid-to-solid contact, a contact which ensures that little or no undesirable, relatively uncontrollable heat conduction occurs. As a result, heating is able to be generated by other, more controllable processes.

In one exemplary implementation of the innovations herein, in the phase of monocrystalline germanium ingot growing, the furnace temperature may be decreased at a rate of about 0.2 to about 0.5° C./hour to allow the monocrystalline germanium ingot to grow.

The sequence of drawings from FIG. 5A through FIG. 5D illustrates another exemplary germanium growth process including features of melting and supplying germanium. Referring to the drawings, FIG. 5A illustrates an initial state of an exemplary process, where the solid germanium is present in both the upper container 4 and the crucible 12. As innovative heating features and processes, an intermediate state of the germanium melt is next shown in FIG. 5B, which illustrates a state wherein the solid germanium has been melted to a liquid in the crucible 12.

The heating elements of the heating zones of the furnace may be adjusted in association with the respective supply of power so that the upper container is provided with required heat energy. Specifically, the upper container may be heated such that the germanium in the upper container 3 begins melting, and the molten germanium flows into the crucible 12 via a hole at the bottom of container 3. In one exemplary implementation, the region of the furnace where the upper container is present is heated to the range of about 940 to about 955 degrees Celsius, or of about 945 degrees to about 950 degrees Celsius. This process continues until all of the germanium in the upper container 3 is melted and flows into the crucible 12.

The furnace 1 as shown in FIGS. 5A-5D is an example of a furnace that may be used for a Vertical Gradient Freeze (VGF) crystal growth process. Other furnaces and configurations, such as Vertical Bridgman, may also be used. In the VGF crystal growth process, the crystallizing temperature gradient within a fixed heat source is being moved electrically while the crystal is stationary.

To carry out vertical gradient freeze growth (VGF), it is necessary to establish an appropriate temperature gradient profile in the furnace. The heating zones of the furnace are controlled separately and individually with regard to their respective power supplies via a computer that is programmed to heat and cool to fulfill the furnace crystallizing temperature and temperature gradient requirements. With regard to the growing of germanium ingots, for example, the furnace temperature fluctuation may be required to be within less than about ±0.1° C. During the preparation of the furnace, the raw germanium polycrystalline material is loaded into the ampoule 3 as described in more detail elsewhere herein.

As shown in the figures, a pBN loading container 4 which has a hole in the tapered portion is seated on a support 6 which is made of quartz located above crucible 12 in the ampoule 3. The loading container 4 allows the crucible 12 to be loaded with more raw materials. In particular, the raw germanium material 5 is typically solid chunks or pieces and therefore cannot be tightly packed into the crucible 12 to be melted. Thus, the loading container is used to hold extra raw material that can be melted and then drain down into the crucible 12 which results in a larger germanium charge in the crucible 12 which in turn results in a larger length and diameter germanium crystal. For example, about 65% of the raw material may be initially loaded into the loading container 4 and 35% of the raw material is loaded directly into the crucible 12. As one non-limiting example, a 5.115 kg charge of raw material is loaded into the crucible 12 and a 9.885 kg charge is loaded into the loading container 4, resulting in a 15000 g (15 kg) charge that produces a 152.4 mm (6 inch) diameter germanium ingot.

In one example, the germanium may be doped with Arsenic (As). Here, for example a 9° Off-orientation <100> seed may be loaded into the crucible before the charge is loaded. The charge of raw material and an appropriate amount of dopant is loaded into the crucible and into the loading container which are placed into the quartz ampoule 3. The ampoule and contents are evacuated to a vacuum of about $2.00 \times 10^{-4}$ Pascal (about $1.5 \times 10^{-6}$ Torr), after which the ampoule is sealed and loaded into the furnace, as shown in FIG. 1A. The furnace is started, and the ampoule and contents are heated so that the raw material in the crucible 12 melts. During the growth, the furnace is at a temperature of approximately 1000° C. since the melting point of germanium is approximately 940° C. The crystallization interface temperature gradient may be adjusted to be about 0.5 to about 10° C./cm according to the different position of the ingot. Further, the overall temperature profile may be adjusted to give a crystallization rate of about 1-2 mm/hr. After the solidification is completed, the furnace may be cooled down at about 20-40° C./hr. Ge ingots resulting from such exemplary processes herein may have micropit densities reproducibly provided within the following ranges: greater than about $0.025/cm^2$ and less than about $0.51/cm^2$; greater than about $0.025/cm^2$ and less than about $0.26/cm^2$; greater than about $0.025/cm^2$ and less than about $0.13/cm^2$; less than about $0.13/cm^2$; and greater than about $0.025/cm^2$ and less than about $0.26/cm^2$.

In another example, the inventive apparatus is composed of a quartz ampoule into which both the pBN loading container and the crucible may be inserted, along with a support 6 to hold the pBN loading container. Regarding exemplary dimensions, the crucible may have a diameter of about 150 mm in the growing crystal section, a length of about 160 mm in the growing crystal section, and a diameter of about 7 mm in the seed crystal section. In one exemplary implementation, a <100> oriented Ge seed crystal was inserted in the seed well of the pBN crucible and 96 g of boron trioxide as the liquid sealant was put into the pBN crucible above the seed. Then, a total of 14,974 g of Ge polycrystalline material was loaded in pBN crucible and pBN container respectively and both pBN container and crucible were inserted in a quartz ampoule and the quartz ampoule under a reduced pressure of about $2.00 \times 10^{-4}$ Pascal ($1.5 \times 10^{-6}$ Torr) was sealed with a quartz cap. The sealed ampoule then was loaded in the furnace and placed on the ampoule support.

The above-described quartz ampoule was heated at the rate of approximately 270° C./hr. When temperature was at about 30° C. over the melting point of the crystallizing material, the heating was maintained until all of the crystalline materials melted.

Figure 6:
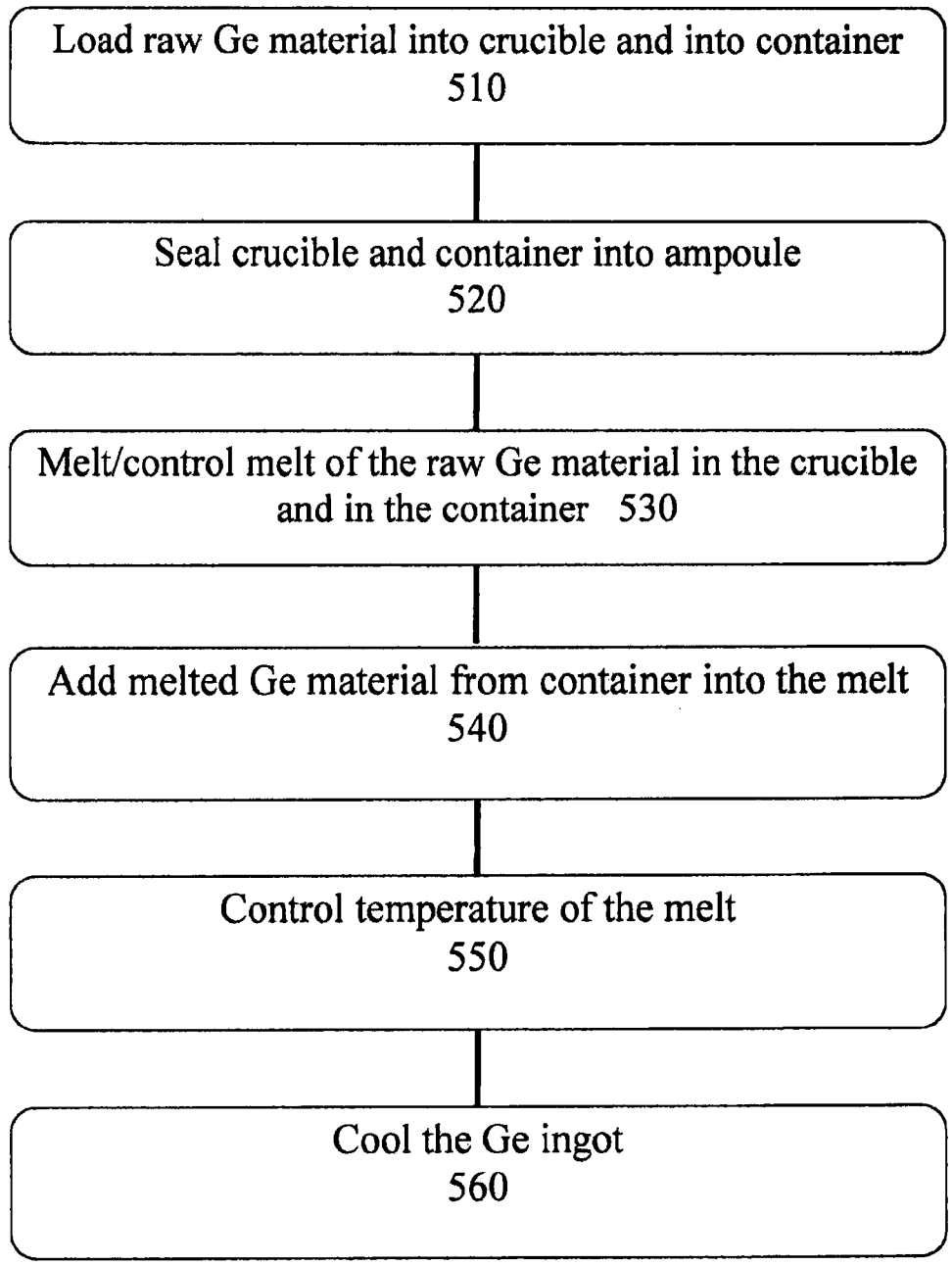
FIG. 6 is a flow diagram showing another exemplary process of crystal growth, consistent with certain aspects regarding the innovations herein.

As set forth in FIG. 6, an exemplary method for growing a monocrystalline germanium (Ge) crystals consistent with the innovations herein is disclosed. In one exemplary implementation, there is provided a method for loading a first raw Ge material into a crucible, said crucible including a seed well holding a seed crystal, loading a second raw Ge material into a container for supplementing raw material, which is to be located within an ampoule, sealing the crucible and the container in said ampoule, placing said ampoule with said crucible and said container in it into a crystal growth furnace, controlling melt of the first raw Ge material in the crucible to create a melt, controlling melt of the second raw Ge material in said container. Further, such methods may include one or more of controlling addition of the melted second raw Ge material to said melt, controlling the crystallizing temperature gradient of the melt so that the melt crystallizes when in contact with the seed crystal and forms a monocrystalline germanium ingot, and cooling the monocrystalline germanium ingot.

Other exemplary implementations may include controlling melt of the second raw Ge material in said container including controlling heating applied to the second raw Ge material and maintaining the melted second raw Ge material within a temperature range. Further, controlling addition of the melted second raw Ge material to said melt may include maintaining said melt within a specified temperature range, and such range may be about 940 to about 955 degrees Celsius, or about 945 to about 950 degrees Celsius. Moreover, controlling addition of the melted second raw Ge material to said melt may include maintaining said melt within a specified temperature range, such as the ranges listed above.

In still other exemplary implementations, heating power and/or one or more cooling rates may be controlled or reduced in a controlled manner to yield Ge ingots having crystal properties within reproducibly provided ranges. Further, as a result of such process control, mono-crystalline germanium ingots having reduced micropit cavity densities (e.g., within any of the other ranges set forth herein), may be reproducibly provided.

Further, by means of the processes set forth herein, germanium crystals having micropit densities within the various ranges above may be reproducibly provided without use of external gas source supplied doping techniques. Aspects of these advantages, for example, may relate to the use of sealed ampoules (e.g., sealed under vacuum, at a pressure or other conditions, etc.) and avoid associated complexities such as the need for expensive gas supply hardware and control system/electronics, etc. In some instances, innovations herein may be advantageously associated with systems and methods that entail non-contact doping techniques. As such, germanium crystals having dislocation densities within the various ranges above may be reproducibly provided without use of contact doping techniques and/or external gas source supplied doping techniques.

In some implementations, VGF methods may be used to perform crystal growth. Further, the heater power may be reduced first in the lowest heating zone to start crystal growth at the seed, and then the heater power may be reduced in the transition region, wherein the cooling rate was at about 0.3 to about 0.4° C./hr. This cooling rate was maintained for approximately 70 hours. Once crystallization reached the main growth region, the heater power in the appropriate zone was reduced to give a cooling rate of about 0.4 to about 0.7° C./hr with a crystallization interface temperature gradient of about 1.2 to about 3.0° C./cm, both of which were maintained for approximately 120 hours. After completion of crystallization, the furnace was cooled at a rate of about 20 to about 40° C./hour until it reached room temperature.

An exemplary, resulting crystal ingot had a 125 mm body length, and is completely single crystal. From the starting growth portion to the end of growth portion, for example, such crystals have low micropit densities, and may also have free carrier concentrations of about $9\times10^{17}$ to about $4\times10^{18}$ or about $5\times10^{18}/cm^3$ (range of about $9\times10^{17}$ to about $4.86\times10^{18}/cm^3$ being measured), and resistivity of about $7\times10^{-3}$ to $2\times10^{-3}$ or $3\times10^{-3}$ $\Omega$cm (range of about $7.29\times10^{-3}$ to about $2.78\times10^{-3}$ Sam being measured), with a mobility of about 950 $cm^2/Vs$ to about 450 $cm^2/Vs$ (values of 955 $cm^2/Vs$ and 467 $cm^2/Vs$ being measured).

As such, it should be noted that any germanium crystal substrates (e.g., ingots, wafers, etc.) produced by the methods/processes of the present disclosure are specifically within ambit of the innovations herein. Further, any products (e.g., electronic or opto-electronic device, etc.) that include such germanium crystal substrates produced by any of the methods/processes herein are also consonant with the present innovations.

While the foregoing has been with reference to a particular implementation of the invention, it will be appreciated by those skilled in the art that changes in this implementation may be made without departing from the principles and spirit of the invention, the scope of which is defined by the appended claims.

The invention claimed is:

1. A method of growing monocrystalline germanium (Ge) crystals in a crystal growth furnace including a heating source, a plurality of heating zones, an ampoule and a crucible, the method comprising:
    loading raw Ge material into the crucible;
    sealing the crucible and the container;
    placing the crucible into the crystal growth furnace having a crucible support;
    melting the raw Ge material in the crucible to create a melt;
    controlling a crystallizing temperature gradient of the melt while placing the melt in contact with the seed crystal;
    forming a monocrystalline germanium ingot via movement of the crystallizing temperature gradient and/or the crucible relative to each other; and
    cooling the monocrystalline germanium ingot;
    wherein monocrystalline germanium ingots having a micro-pit density (MPD) of greater than about $0.025/cm^2$ and less than about $0.51/cm^2$ are reproducibly provided.

2. The method of claim 1 wherein monocrystalline germanium ingots having a micro-pit density of greater than about $0.025/cm^2$ and less than about $0.26/cm^2$ are provided.

3. The method of claim 1 wherein monocrystalline germanium ingots having a micro-pit density of greater than about $0.025/cm^2$ and less than about $0.13/cm^2$ are provided.

4. The method of claim 1 wherein monocrystalline germanium ingots having a micro-pit density less than about $0.13/cm^2$ are provided.

5. The method of claim 1 wherein monocrystalline germanium ingots having a micro-pit density of greater than about $0.025/cm^2$ and less than about $0.26/cm^2$ are provided.

6. The method of claim 1 further comprising adding Arsenic (As) as a dopant to the germanium crystal.

7. The method of claim 1 further comprising adding Gallium (Ga) as a dopant to the germanium crystal.

8. A single crystal germanium product produced by a process of:
    loading raw Ge material into a crucible;
    sealing the crucible;
    placing the crucible into a crystal growth furnace having a crucible support;
    melting the raw Ge material in the crucible to create a melt;
    controlling a crystallizing temperature gradient of the melt while placing the melt in contact with the seed crystal;
    forming a monocrystalline germanium ingot via movement of the crystallizing temperature gradient and/or the crucible relative to each other; and
    cooling the monocrystalline germanium ingot;
    wherein the product includes germanium from a monocrystalline germanium ingot, produced by the process, having a micro-pit density (MPD) of greater than about $0.025/cm^2$ and less than about $0.51/cm^2$ are reproducibly provided.

9. The product of claim 8 wherein the monocrystalline germanium ingot has a micro-pit density of greater than about $0.025/cm^2$ and less than about $0.26/cm^2$ are provided.

10. The product of claim 8 wherein the monocrystalline germanium ingot has a micro-pit density of greater than about $0.025/cm^2$ and less than about $0.13/cm^2$ are provided.

11. The product of claim 8 wherein the monocrystalline germanium ingot has a micro-pit density less than about $0.13/cm^2$ are provided.

12. The product of claim 8 wherein the monocrystalline germanium ingot has a micro-pit density of greater than about $0.025/cm^2$ and less than about $0.26/cm^2$ are provided.

13. The product of claim 8 wherein the monocrystalline germanium ingot is formed using Arsenic (As) as a dopant to the germanium crystal.

14. The product of claim 8 wherein the monocrystalline germanium ingot is formed using Gallium (Ga) as a dopant to the germanium crystal.

* * * * *